(12) United States Patent
Liu et al.

(10) Patent No.: US 7,109,125 B1
(45) Date of Patent: *Sep. 19, 2006

(54) SELECTIVE FABRICATION OF HIGH CAPACITANCE DENSITY AREAS IN A LOW DIELECTRIC CONSTANT MATERIAL

(75) Inventors: Q. Z. Liu, Irvine, CA (US); David Feiler, Irvine, CA (US); Bin Zhao, Irvine, CA (US); Phil N. Sherman, Irvine, CA (US); Maureen Brongo, Laguna Hills, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/995,762

(22) Filed: Nov. 22, 2004

Related U.S. Application Data

(63) Continuation of application No. 09/575,055, filed on May 19, 2000, now Pat. No. 7,049,246.

(51) Int. Cl.
*H01L 21/302* (2006.01)
*H01L 21/461* (2006.01)
*H01L 21/20* (2006.01)
*H01L 21/8242* (2006.01)

(52) U.S. Cl. .................... 438/735; 438/240; 438/243; 438/386

(58) Field of Classification Search ................ 438/240, 438/243–244, 246–247, 386–387, 389, 390
See application file for complete search history.

(56) References Cited

U.S. PATENT DOCUMENTS 5,928,960 A * 7/1999 Greco et al. ................ 438/692
6,110,842 A * 8/2000 Okuno et al. ............... 438/776
6,271,127 B1 * 8/2001 Liu et al. .................... 438/638

* cited by examiner

*Primary Examiner*—Chuong Anh Luu
(74) *Attorney, Agent, or Firm*—Farjami & Farjami LLP

(57) ABSTRACT

Method for selective fabrication of high capacitance density areas in a low dielectric constant material and related structure are disclosed. In one embodiment, a first area of a dielectric layer is covered, for example with photoresist, while a second area of the dielectric layer is exposed to a dielectric conversion source such as E-beams, I-beams, oxygen plasma, or an appropriate chemical. The exposure causes the dielectric constant of the dielectric layer in the second area to increase. A number of capacitor trenches are etched in the second area of the dielectric. The capacitor trenches are then filled with an appropriate metal, such as copper, and a chemical mechanical polish is performed. The second area in which the capacitor trenches have been etched and filled has a higher capacitance density relative to the first area. In another embodiment, the exposure to the dielectric conversion source is not performed until after the chemical mechanical polish has been performed. In yet another embodiment, a blanket layer of metal, such as aluminum, is first deposited. The blanket layer of metal is then etched to form metal lines. Then a gap fill dielectric is utilized to fill the gaps between the remaining metal lines. A first area of the gap fill dielectric is then covered and a second area of the gap fill dielectric is exposed to a dielectric conversion source. After exposure to the dielectric conversion source, the dielectric constant of the gap fill dielectric in the second area increases. The metal lines in the second area can then be used as capacitor electrodes of a high density capacitor.

18 Claims, 3 Drawing Sheets

US 7,109,125 B1

SELECTIVE FABRICATION OF HIGH CAPACITANCE DENSITY AREAS IN A LOW DIELECTRIC CONSTANT MATERIAL

This application is a Con. of 09/575,055 filed on May 19, 2000, now U.S. Pat. No. 7,049,246 B1

BACKGROUND OF THE INVENTION

1. FIELD OF THE INVENTION

The present invention is in the field of integrated circuit fabrication. In particular the present invention is in the field of high density capacitors in semiconductor chips.

2. BACKGROUND ART

Semiconductor chips comprise both digital circuits and analog circuits. Digital circuits have different capacitance requirements than analog circuits. Due to the slowing effects of unwanted parasitic capacitance, digital circuits on the semiconductor chip generally require low capacitance. In contrast, analog circuits on the semiconductor chip need capacitors with high capacitance density. Thus, for digital circuits there is a drive to decrease capacitance while for analog circuits there is a need to increase the capacitance density.

Device engineers seeking to increase capacitance density in analog circuits on the semiconductor die may attempt to do so in several ways. It is well known that the capacitance value of a parallel plate capacitor is calculated by the equation:

$$C = (\epsilon_0 \epsilon_r A)/d \qquad \text{(Equation 1)}$$

where $\epsilon_0$ is the permittivity of the free space ($\epsilon_0 = 8.85 \times 10^{-14}$ F/cm), $\epsilon_r$ is the relative permittivity (also referred to as dielectric constant or "k"), A is the surface area of the capacitor plate and d is the thickness of the dielectric layer.

Device engineers seeking to gain a higher capacitance density on the semiconductor die for use in analog circuits can do so, based on Equation 1, by increasing the area (A in Equation 1) of the capacitor plates, by reducing the thickness of the dielectric between the capacitor plates (d in Equation 1), or by increasing the relative permittivity of the dielectric material used between the capacitor plates ($\epsilon_r$ in Equation 1, also known as dielectric constant or "k").

Due to process limitations, the limited surface area of the semiconductor die, and increased fabrication and manufacturing costs, design engineers can only reduce d or increase A to a limited extent. Therefore, to attain a higher capacitance density on the semiconductor die for analog circuits design engineers have used relatively high dielectric constant materials for the inter-layer dielectrics used in the semiconductor die.

While the use of high dielectric constant materials in the semiconductor die facilitates the fabrication of capacitors with high capacitance density and is therefore desirable for analog circuits, for digital circuits in the semiconductor chip the use of high dielectric constant dielectric has many disadvantages. One of the disadvantages for digital circuits is an increase in the inter-line coupling capacitance between metal lines. Such capacitance causes "noise" or "crosstalk" between metal lines.

Another disadvantage is the increase in capacitance between different layers of interconnect and also an increase in capacitance between a layer of interconnect to the substrate. It is known in the art that a higher capacitance will increase the interconnect metal line delay, i.e. the "RC" delay. Another disadvantage is the significant increase in power consumption resulting from the higher capacitance since the amount of power consumed is directly proportional to the capacitance.

Thus it is seen that there are conflicting requirements for digital and analog circuits in the semiconductor chip. While analog circuits require capacitors to be fabricated at high capacitance density, digital circuits do not require capacitors as part of the circuit and as such low capacitance is desirable for digital circuits for the reasons stated above. However, the use of a low dielectric constant ("low-k") materials in semiconductor die fabrication to generally decrease capacitance and avoid the disadvantages to digital circuits detailed above runs counter to the need to fabricate high density capacitors for use in the analog circuits.

Device engineers have used metal-insulator-metal ("MIM") and metal-insulator-semiconductor ("MIS") capacitors in semiconductor dies. However, in a process utilizing low dielectric constant dielectrics, it is difficult to achieve a high density MIM or MIS capacitor because of the low dielectric constant of the dielectrics used and also because additional process steps and an extra mask may be required.

Another method that can be used to overcome the conflicting capacitance requirements of digital and analog circuits is to construct one dielectric layer which has a low dielectric constant and has all the advantages discussed above for the digital circuits and another separate layer which has a high dielectric constant and is suitable for fabrication of high density capacitors for analog circuits. However, this leads to increased fabrication costs and may not even be attainable with today's fabrication techniques. It would be very desirable to fabricate both digital and analog circuits using the same dielectric material while ensuring a low capacitance for the digital circuits and a high capacitance density for the analog circuits.

Thus, it can be seen that there is a serious need in the art for a way to achieve high density capacitors for the analog areas of a semiconductor die while at the same time achieving a low capacitance digital area.

SUMMARY OF THE INVENTION

The present invention is method for selective fabrication of high capacitance density areas in a low dielectric constant material and related structure. In one embodiment, a first area of a dielectric layer is covered, for example with photoresist, while a second area of the dielectric layer is exposed to a dielectric conversion source such as E-beams, I-beams, oxygen plasma, or an appropriate chemical. The exposure causes the dielectric constant of the dielectric layer in the second area to increase. A number of capacitor trenches are etched in the second area of the dielectric. The capacitor trenches are then filled with an appropriate metal, such as copper, and a chemical mechanical polish is performed. The second area in which the capacitor trenches have been etched and filled has a higher capacitance density relative to the first area. In another embodiment, the exposure to the dielectric conversion source is not performed until after the chemical mechanical polish has been performed.

In yet another embodiment, a blanket layer of metal, such as aluminum, is first deposited. The blanket layer of metal is then etched to form metal lines. Then a gap fill dielectric is utilized to fill the gaps between the remaining metal lines. A first area of the gap fill dielectric is then covered and a second area of the gap fill dielectric is exposed to a dielectric conversion source. After exposure to the dielectric conversion source, the dielectric constant of the gap fill dielectric in the second area increases. The metal lines in the second area can then be used as capacitor electrodes of a high density capacitor.

DETAILED DESCRIPTION OF THE INVENTION

The present invention is method for selective fabrication of high capacitance density areas in a low dielectric constant material and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

In the present embodiment, the invention is explained by reference to a damascene process. The term "damascene" is derived from the ancient in-laid metal artistry originated in Damascus. According to the damascene process, trenches are cut into the dielectric and then filled with metal. Then excess metal over the wafer surface is removed to form desired interconnect metal patterns within the trenches. In the present embodiment copper is used as the metal and a dielectric with a low dielectric constant is used as the inter-layer dielectric.

It is known that when a dielectric material is exposed to Electron beams (E-beams) or Ion beams (I-beams) the properties of the dielectric material can change. This was explained in a co-pending application entitled "Fabrication Of Improved Low-K Dielectric Structures," filed on Apr. 25, 2000, Ser. No. 09/559,292, and assigned to the assignee of the present application. The disclosure in that co-pending application is hereby fully incorporated by reference into the present application. In the present application, E-beams or I-beams are referred to as a "dielectric conversion source."

It is noted in particular that a low dielectric constant material can be converted to a high dielectric constant material. As discussed above, a higher dielectric constant results in higher capacitance. By exposing a dielectric layer to E-beams or I-beams, for example, the dielectric layer could be converted to a higher dielectric constant and thus be more suitable for use in analog circuits requiring a high capacitance density. Moreover, as was explained in the above-referenced co-pending application, E-beams or I-beams can be specifically used for converting low dielectric constant material to high dielectric constant material in a copper damascene process.

Figure 1A:
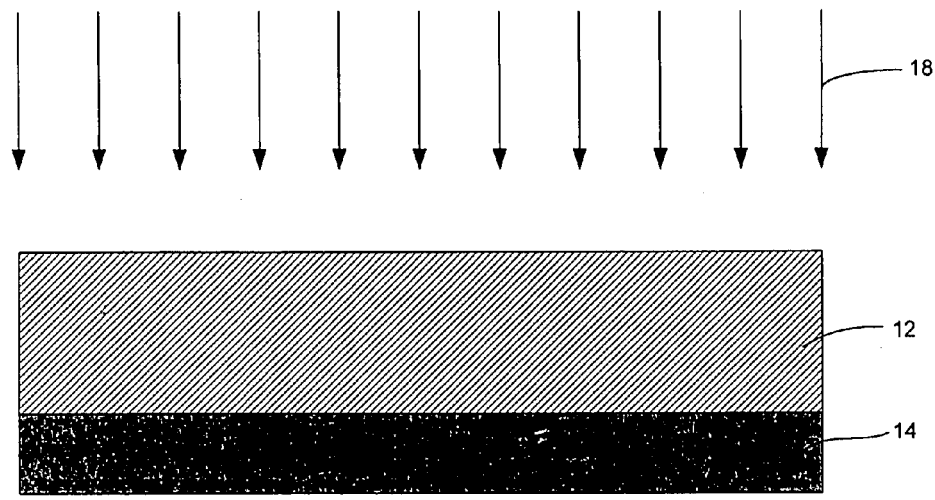
FIG. 1A shows a step of dielectric conversion performed prior to initiation of a damascene fabrication process.
Figure 1B:
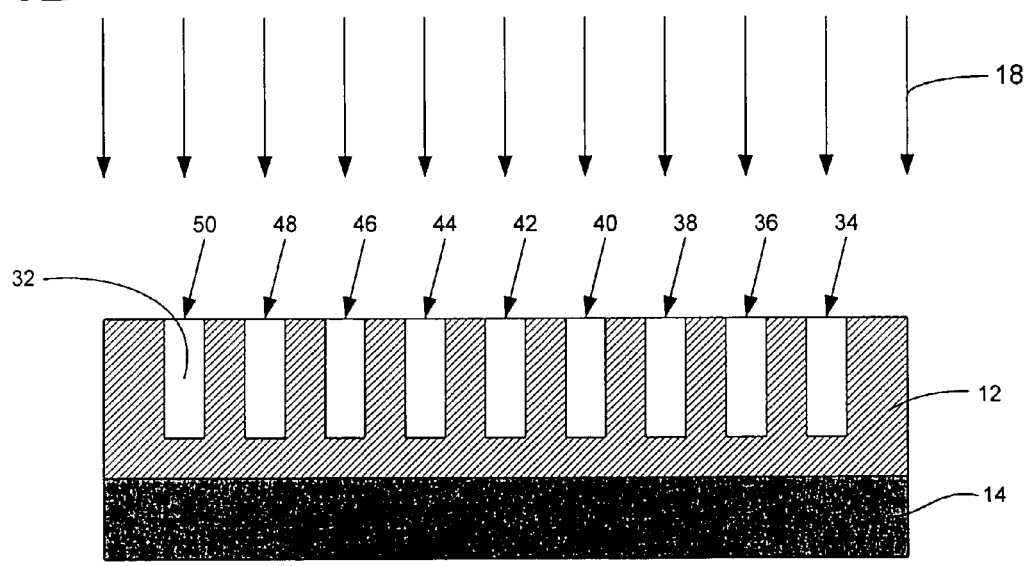
FIG. 1B shows a step of dielectric conversion performed after the completion of a damascene fabrication process.

FIGS. 1A and 1B illustrate cross sections of a semiconductor die. Inter-layer dielectric 12 is shown resting on semiconductor substrate 14. Semiconductor substrate 14 is usually made of silicon. Inter-layer dielectric 12 can be a low dielectric constant material such as hydrogen silsesquioxane (HSQ). In the embodiment of the invention using a copper damascene process, dielectric conversion can be performed either prior to the start of a damascene fabrication process, or after the completion of a damascene fabrication process. In the present application, the dielectric constant of the initial dielectric material is referred to as a "first dielectric constant" and the dielectric constant of the "converted" dielectric material is referred to as a "second dielectric constant." FIG. 1A shows the step of conversion of inter-layer dielectric 12 being performed prior to the beginning of a damascene fabrication process, i.e. prior to etching any trenches in inter-layer dielectric 12. In contrast, FIG. 1B shows the conversion step being performed after the completion of a damascene fabrication process, i.e. after trenches 34, 36, 38, 40, 42, 44, 46, 48 and 50 have been etched in inter-layer dielectric 12 and filled with copper 32 and a chemical mechanical polish ("CMP") has been performed.

Due to the conversion of the initially low dielectric constant inter-layer dielectric 12 either prior to the beginning of a damascene fabrication process or after the completion of a damascene fabrication process, the dielectric constant of inter-layer dielectric 12 will increase and a high density capacitance will be achievable.

Figure 2A:
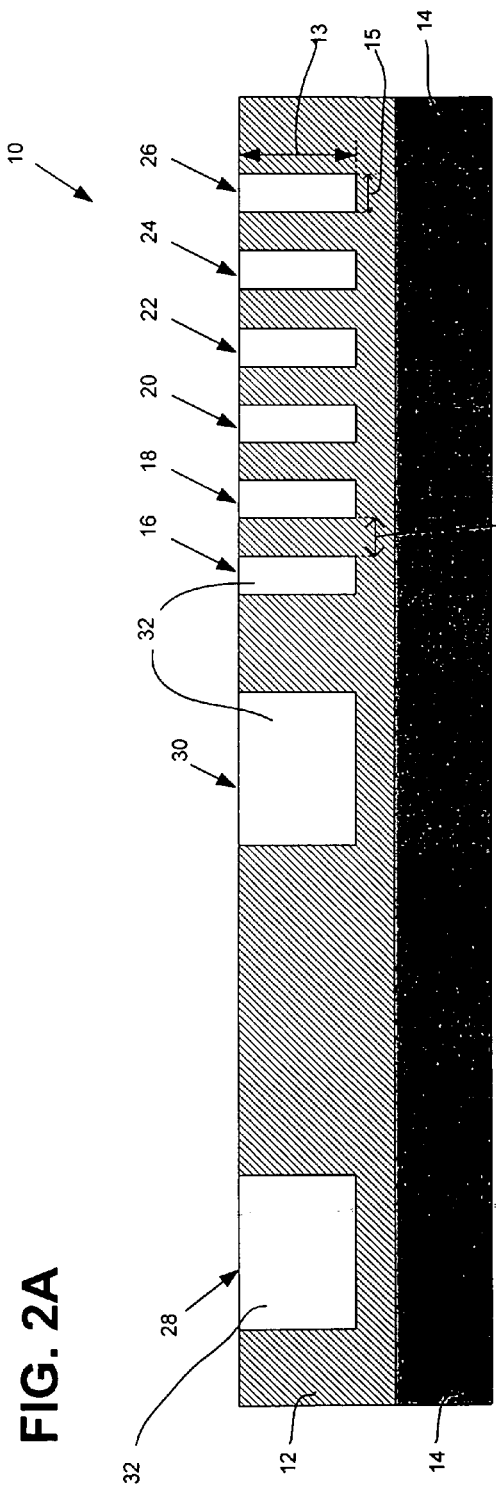
FIG. 2A illustrates a cross section view of a portion of a semiconductor die containing a composite capacitor and two interconnect trenches.

FIG. 2A illustrates a cross section of semiconductor die 10 after "capacitor trenches" 16, 18, 20, 22, 24 and 26 and "interconnect trenches" 28 and 30 have been etched in inter-layer dielectric 12 and filled with copper 32 and a CMP has been performed to remove the excess copper from the surface of the low dielectric constant dielectric 12. As an example, inter-layer dielectric 12 can be a low dielectric constant dielectric such as hydrogen silsesquioxane (HSQ). In the present application, the area in which interconnect trenches 28 and 30 are etched is referred to as a "first area" while the area in which capacitor trenches 16, 18, 20, 22, 24 and 26 are etched is referred to as a "second area."

Capacitor trenches 16, 18, 20, 22, 24 and 26 and interconnect trenches 28 and 30 have been etched into inter-layer dielectric 12 and have been filled with copper 32 using processes known in the art. Capacitor trenches 16, 18, 20, 22, 24 and 26 are part of a composite capacitor which is described in more detail in a later section of this application. Interconnect trenches 28 and 30 are not part of any capacitors and are used solely to carry electrical signals in semiconductor die 10.

Referring again to FIG. 2A, the depth of capacitor trenches 16, 18, 20, 22, 24 and 26 is referred to by numeral 13 and in the present embodiment is approximately 0.4 to 0.6 microns. The width of capacitor trenches 16, 18, 20, 22, 24 and 26 is referred to by numeral 15 and in the present embodiment is approximately 0.2 microns. The distance between capacitor trenches 16 and 18, between capacitor trenches 18 and 20, capacitor trenches 20 and 22, capacitor trenches 22 and 24, or capacitor trenches 24 and 26 is referred to by numeral 17 and in the present embodiment is approximately 0.2 microns.

Figure 2B:
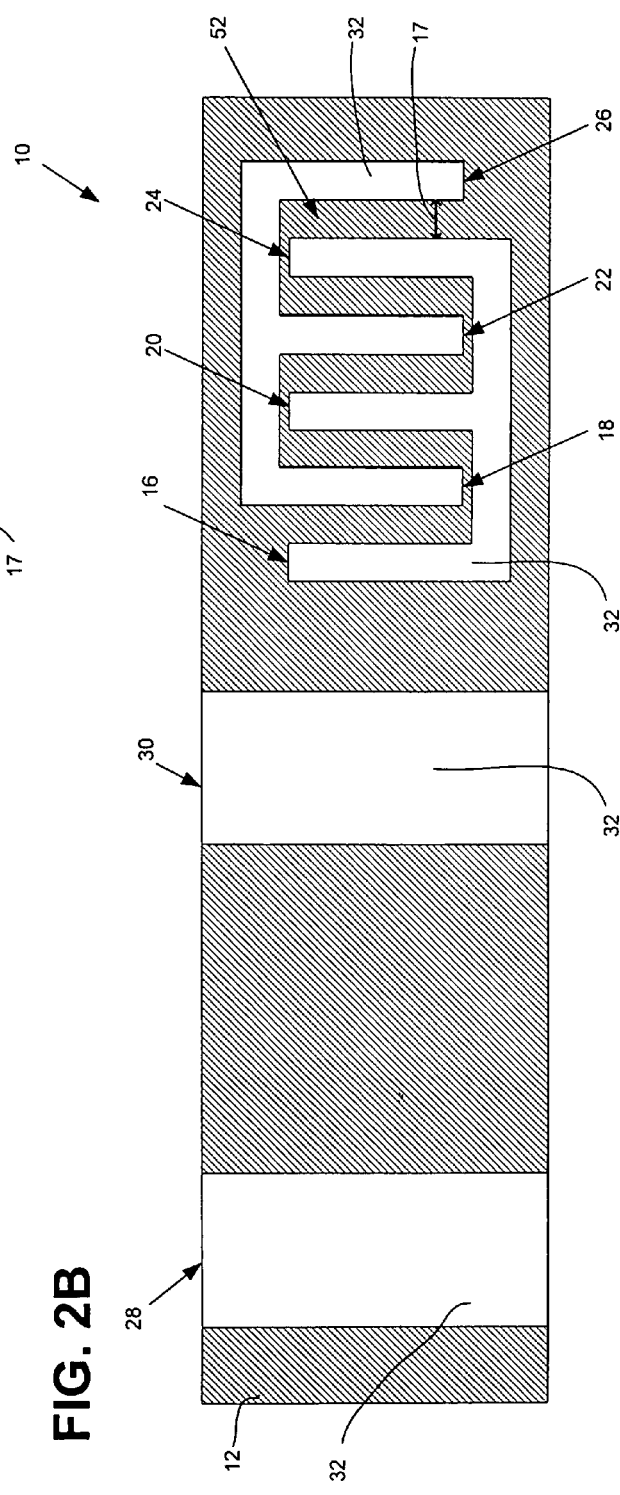
FIG. 2B illustrates a top view of a portion of a semiconductor die corresponding to the cross section view in FIG. 2A.

FIG. 2B illustrates a top view of semiconductor die 10 corresponding to the cross section view shown in FIG. 2A. It can be seen from the top view shown in FIG. 2B that capacitor trenches 16, 18, 20, 22, 24 and 26 are etched into inter-layer dielectric 12 as a "comb structure." It can be seen from the top view shown in FIG. 2B that capacitor trenches 16, 20 and 24 are electrically connected and form a first electrode of a composite capacitor. Similarly, capacitor trenches 18, 22, and 26 are electrically connected and form a second electrode of the composite capacitor. Although in this embodiment the composite capacitor consists of a total of six capacitor trenches, the number of capacitor trenches used to build the capacitor could manifestly be greater or fewer than six without departing from the spirit or scope of the invention. In FIG. 2B, a portion of dielectric 12 situated between two adjacent trenches in the composite capacitor is referred to generally by numeral 52 and its thickness is referred to by numeral 17.

Figure 3:
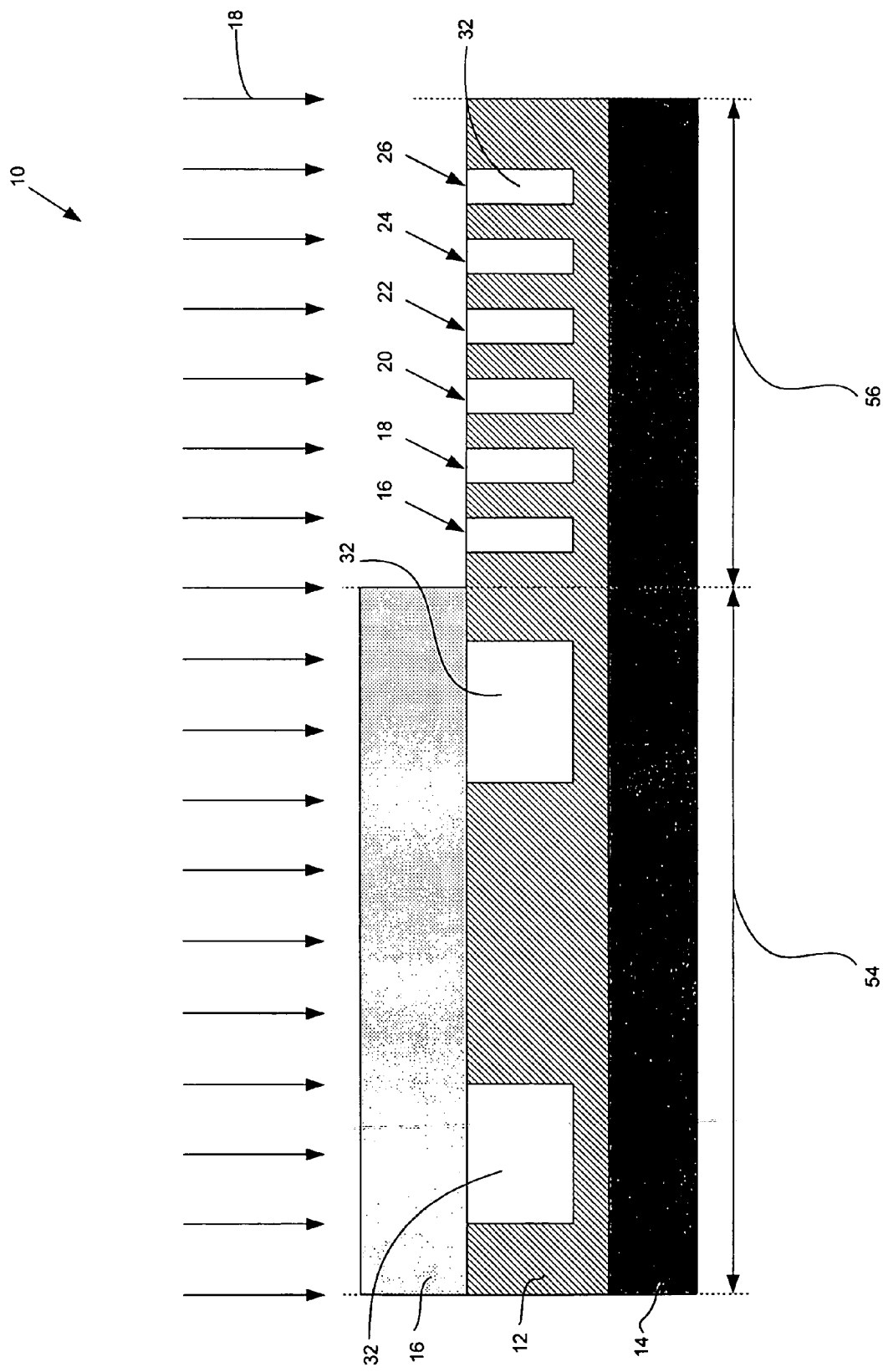
FIG. 3 illustrates a cross section view of a portion of a semiconductor die during a selective dielectric conversion step.

FIG. 3 shows the same cross section view of semiconductor die 10 as was shown in FIG. 2B and illustrates the step of converting a low dielectric constant material to a high dielectric constant material. The area of semiconductor die 10 referred to by numeral 54 is used as a part of a digital circuit. Area 54 of semiconductor die 10 is where a low capacitance is desired. The area of semiconductor die 10 referred to by numeral 56 is used as a part of an analog circuit. Area 56 of semiconductor die 10 is where a high capacitance density is desired in order to build capacitors.

The invention uses the method described below to selectively convert inter-layer dielectric 12 in the area referred to by numeral 56 to a high dielectric constant material while leaving inter-layer dielectric 12 in the area referred to by numeral 54 unconverted so that it remains a low dielectric constant material.

FIG. 3 shows photoresist 16 patterned over interconnect trenches 28 and 30, which are situated in the area of semiconductor die 10 used as a part of a digital circuit. Photoresist 16 does not cover capacitor trenches 16, 18, 20, 22, 24 and 26 which are situated in the area of semiconductor die 10 used as part of an analog circuit. The patterning of photoresist 16 is done in a manner known in the art.

FIG. 3 also illustrates the exposure of the surface of semiconductor die 10 to E-beams or I-beams 18. As discussed above, when a dielectric material is exposed to E-beams or I-beams, the properties of the dielectric material can change and the dielectric constant (i.e. the "k" value) of the material can increase.

As seen in FIG. 3, photoresist 16 prevents area 54 of semiconductor die 10 from being exposed to E-beams or I-beams 18. Thus, inter-layer dielectric 12 located under photoresist 16 remains unconverted and maintains a low dielectric constant since the portion of inter-layer dielectric 12 under photoresist 16 remains unexposed to E-beams 18 or I-beams 18. However, inter-layer dielectric 12 situated in the area 56 of semiconductor die 10 is not protected by photoresist 16 and is converted to a higher dielectric constant material after exposure to E-beams 18 or I-beams 18.

Thus, after the dielectric conversion step, inter-layer dielectric 12 surrounding capacitor trenches 16, 18, 20, 22, 24 and 26 in the area of semiconductor die 10 referred to by numeral 56 is converted to become a high dielectric constant material. Inter-layer dielectric 12 surrounding interconnect trenches 28 and 30 in the area of semiconductor die 10 referred to by numeral 54 remains an unconverted low dielectric constant material.

As discussed above, since converted inter-layer dielectric 12 has a higher dielectric constant as a result of dielectric conversion, a composite capacitor fabricated in the area of semiconductor die 10 referred to by numeral 56 will have a higher capacitance than a capacitor built using unconverted inter-layer dielectric 12.

In another embodiment of the invention, an aluminum subtractive etching process is used instead of the copper damascene process. The invention's aluminum subtractive etching process begins with depositing a blanket layer of aluminum. Thereafter, the blanket layer of aluminum is etched and the remaining line of aluminum form a desired pattern. During a "gap fill" process, the gaps between the aluminum lines which remain after etching are filled with a low dielectric constant material such as hydrogen silsesquioxane ("HSQ"). The gap fill can be performed using a chemical vapor deposition ("CVD") or a spin-on process. In the present application, the dielectric material utilized to perform the "gap fill" process is referred to as a "gap fill dielectric."

Thereafter photoresist is used to aid in selectively converting the underlying gap fill low dielectric constant material. Photoresist is patterned over the area which is to remain unconverted in the underlying gap filler low-k dielectric. The area of the gap fill low-k dielectric which is to be converted is then exposed to E-beams or I-beams. After the dielectric conversion step, the photoresist is stripped using a method known in the art. Then, a blanket layer of CVD oxide is deposited. The surface of the semiconductor die is then planarized by a CMP process. In the present application, the area in which the initial low-k dielectric remains unchanged is referred to as the "first area" while the area in which the initial low-k dielectric is converted to a dielectric with a higher dielectric constant is referred to as a "second area." Also, in the present application, the aluminum lines in the first area are referred to as "interconnect lines" and the aluminum lines in the second area are referred to as "capacitor electrodes."

One difference between the invention's method using the damascene copper/low-k process in the first embodiment of the invention and the subtractive etching aluminum/low-k process in the second embodiment of the invention is that in the damascene copper/low-k process the dielectric conversion could be done either prior to the initiation of the damascene fabrication process or after the completion of the damascene fabrication process. However, in the subtractive etching aluminum/low-k fabrication process, the conversion of the dielectric by E-beams or I-beams cannot be performed prior to the initiation of the subtractive etching aluminum/low-k fabrication process. Moreover, in the subtractive etching aluminum/low-k fabrication process the conversion of the low-k dielectric by E-beams or I-beams cannot be performed even after the completion of the subtractive etching aluminum/low-k fabrication process.

In contrast, in one implementation of the embodiment of the invention using subtractive etching and aluminum/low-k fabrication process, the conversion of the gap filler low-k dielectric by E-beams or I-beams is performed after the initial step of patterning the aluminum and the gap fill process, but before the final step of depositing a blanket layer of CVD oxide and the application of the CMP. It is desirable to expose the gap filler low-k dielectric to E-beams or I-beams prior to the final step of depositing a blanket layer of CVD oxide since the E-beams or I-beams cannot adequately pass through the blanket layer of CVD oxide to convert the gap filler low-k dielectric if the blanket layer of CVD oxide were deposited over the gap filler low-k dielectric prior to exposure to E-beams or I-beams.

In another implementation of this embodiment of the invention, the conversion of the gap filler low-k dielectric by E-beams or I-beams is performed after the final step of depositing a blanket layer of CVD oxide and the application of the CMP. However, in this implementation, a high energy E-beam or I-beam source must be used so that the high energy E-beams or I-beams can adequately pass through the blanket layer of CVD oxide to convert the gap filler low-k dielectric.

From the above description of the invention it is manifest that various techniques can be used for implementing the concepts of the present invention without departing from its scope. In one embodiment, the conversion of inter-layer dielectric 12 could be achieved through plasma treatment instead of using E-beams or I-beams. For example, oxygen plasma could be used to convert a low dielectric constant inter-layer dielectric 12 to a higher dielectric constant dielectric. Another embodiment for converting inter-layer dielectric 12 is through chemical treatment. For example, an amine based chemical can be used to convert a low dielectric constant inter-layer dielectric 12 to a higher dielectric constant dielectric. In the present application, oxygen plasma or a chemical used to convert a low-k dielectric material to a material with a higher dielectric constant is referred to as a "dielectric conversion source."

In addition, various low dielectric constant material other than HSQ, which was used merely as an example in the present application, can be used. Furthermore, the various dimensions and sizes specifically mentioned in the present application can be varied without departing from the scope of the present invention.

As discussed above, the invention's method has overcome the challenge to achieve areas of low capacitance for digital circuits and areas of high capacitance density for analog circuits. Thus, method for selective fabrication of high capacitance density areas in a low dielectric constant material and related structure have been described.

The invention claimed is:

1. A method comprising steps of:
   etching a plurality of interconnect trenches in a first area in a dielectric layer and etching a plurality of capacitor trenches in a second area in said dielectric layer, said dielectric layer comprising a low dielectric constant material;
   covering said first area in said dielectric layer, said dielectric layer having a first dielectric constant;
   exposing said second area in said dielectric layer to a dielectric conversion source so as to increase said first dielectric constant of said dielectric layer in said second area to a second dielectric constant.

2. The method of claim 1 wherein said covering step comprises covering said first area in said dielectric layer with photoresist.

3. The method of claim 1 wherein said low dielectric constant material is hydrogen silsesquioxane.

4. The method of claim 1 further comprising a step of filling each of said plurality of capacitor trenches and each of said plurality of interconnect trenches with metal after said etching step and prior to said covering step.

5. The method of claim 4 wherein said metal is copper.

6. A method comprising:
   forming a dielectric layer in a semiconductor die, said dielectric layer having a first dielectric constant, said dielectric layer comprising a low dielectric constant material;
   covering a first area of said dielectric layer;
   exposing a second area in said dielectric layer to a dielectric conversion source so as to increase said first dielectric constant of said dielectric layer in said second area to a second dielectric constant;
   etching a plurality of interconnect trenches in said first area in said dielectric layer;
   etching a plurality of capacitor trenches in said second area in said dielectric layer;
   filling said plurality of interconnect trenches and said plurality of capacitor trenches with metal;
   wherein said plurality of capacitor trenches form a composite capacitor.

7. The method of claim 6 further comprising a step of performing a chemical mechanical polish after said filling step.

8. The method of claim 6 wherein said metal is copper.

9. A method comprising:
   forming a dielectric layer in a semiconductor die, said dielectric layer having a first dielectric constant, said dielectric layer comprising a low dielectric constant material;
   etching a plurality of interconnect trenches in a first area in said dielectric layer;
   etching a plurality of capacitor trenches in a second area in said dielectric layer;
   filling said plurality of interconnect trenches and said plurality of capacitor trenches with metal;
   performing a chemical mechanical polish on said first and second areas;
   exposing said second area in said dielectric layer to a dielectric conversion source so as to increase said first dielectric constant of said dielectric layer in said second area to a second dielectric constant;
   wherein said plurality of capacitor trenches form a composite capacitor.

10. The method of claim 9 wherein said metal is copper.

11. A method comprising:
    depositing a metal layer in a semiconductor die;
    etching said metal layer to form a plurality of interconnect lines in a first area of said semiconductor die and a plurality of capacitor electrodes in a second area of said semiconductor die;
    depositing a gap fill dielectric between said plurality of capacitor electrodes and between said plurality of interconnect lines, said gap fill dielectric comprising a low dielectric constant material;
    covering said first area in said gap fill dielectric, said gap fill dielectric having a first dielectric constant;
    exposing said second area in said gap fill dielectric to a dielectric conversion source so as to increase said first dielectric constant of said gap fill dielectric in said second area to a second dielectric constant;
    wherein said plurality of capacitor electrodes form a composite capacitor.

12. The method of claim 11 wherein said covering step comprises covering said first area in said gap fill dielectric with photoresist.

13. The method of claim 11 wherein said dielectric conversion source comprises E-beams.

14. The method of claim 11 wherein said dielectric conversion source comprises I-beams.

15. The method of claim 11 wherein said dielectric conversion source comprises an amine based chemical.

16. The method of claim 11 wherein said dielectric conversion source comprises oxygen plasma.

17. The method of claim 11 wherein said low dielectric constant material is hydrogen silsesquioxane.

18. The method of claim 11 wherein said metal layer comprises aluminum.

* * * * *